(12) United States Patent
Hara et al.

(10) Patent No.: US 6,171,514 B1
(45) Date of Patent: Jan. 9, 2001

(54) POLISHING METHOD FOR PLANARIZING A SUBSTRATE

(75) Inventors: Kouichi Hara; Norikazu Ozaki, both of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/033,959

(22) Filed: Mar. 3, 1998

(30) Foreign Application Priority Data

Sep. 5, 1997 (JP) .................................................. 9-241409

(51) Int. Cl.[7] .......................... C03C 15/00; C03C 25/68; H01L 21/302; H01L 21/304; B24B 1/00
(52) U.S. Cl. .............................. 216/89; 216/88; 438/692; 438/693
(58) Field of Search .................................. 216/88, 89, 90; 438/690, 691, 692, 693

(56) References Cited

U.S. PATENT DOCUMENTS

| 5,272,117 | * | 12/1993 | Roth et al. | 437/228 |
| 5,693,239 | * | 12/1997 | Wang et al. | 216/88 |
| 5,770,095 | * | 6/1998 | Sasaki et al. | 216/38 |

OTHER PUBLICATIONS

Pan Pacific Microelectronics Symposium—Proceedings of the Technical Program—Honolulu, Hawaii, Feb. 6–9, 1996, (Discussed at p. 2 of the specification).*

* cited by examiner

Primary Examiner—Jeffrie R Lund
Assistant Examiner—Alva C Powell
(74) Attorney, Agent, or Firm—Armstrong, Westerman, Hattori, McLeland & Naughton

(57) ABSTRACT

A polishing method for planarizing a substrate which provides an efficient polishing so that a time needed for polishing is reduced as compared to the conventional method. A first polishing process removes a portion of a polish stop layer that covers a high area by using a first slurry having a high polishing capability against the polish stop layer. A second polishing process, subsequent to the first polishing process, removes the high area by using a second slurry having a high polishing capability for polishing a material covered by the polish stop layer. A polishing capability of the second slurry for polishing the polish stop layer is lower than the polishing capability of the first slurry for polishing the polish stop layer.

7 Claims, 4 Drawing Sheets

POLISHING METHOD FOR PLANARIZING A SUBSTRATE

BACKGROUND OF THE INVENTION

1. Field of the Invention

The present invention generally relates to a polishing method for planarizing a substrate and, more particularly, to a polishing method for planarizing a substrate which is applied to fabrication of a multi-layer thin film substrate.

The multi-layer thin film substrate is formed by stacking a plurality of layers on a substrate base. A polishing process is performed each time a single layer is formed so that each layer is formed with a high degree of precision. In order to improve productivity of such a multi-layer thin film substrate, it is desired to reduce the process time of a polishing process which takes a relatively long time as compared to that of other processes.

2. Description of the Related Art

When an attempt is made to provide a wiring layer to have a multi-layered structure, thickness is varied between an area where a via or a wiring is formed and an area where such a via or a wiring is not provided. This makes it difficult to provide a multi-layered wiring layer. Accordingly, a wiring layer can be formed in a three-layered structure at the maximum. If the number of layers is increased, a yield or production rate of the multi-layer thin film substrate is considerably decreased. In order to achieve a multi-layered structure having more layers, a method is used in which surface planarization is performed after each layer is formed. Such planarization is accomplished by a polishing referred to as chemical-mechanical polishing (CMP).

However, in order to increase the number of layers or improve the yield rate, polishing by CMP alone is not sufficient, and a further planarization technique is needed. Such a planarization technique is disclosed in "CHEMICAL MECHANICAL POLISHING (CMP) OF COPPER/POLYIMIDE WITH POLISH STOP FOR MICROELECTRONIC INTEGRATION" for the Proceedings of the technical program for the Pan Pacific Microelectronics Symposium, Honolulu, Hi., Feb. 6–8, 1996. In this technique, a photoresist layer is formed on an upper surface of a ceramic substrate base on which a first-layer wiring pattern and pads are formed. An aperture is formed in the photoresist layer at a position corresponding to each of the pads. Then, a copper interconnecting post is formed within each aperture by using a CVD method or a plating method. Thereafter, the photoresist layer is removed, and a dielectric (polyimide) layer is formed. After that, a hard mask layer (stop layer) of tungsten is formed on the dielectric layer. The thus formed structure is polished by CMP using a slurry having a low polishing capability when used on tungsten. According to this method, a fairly good planar layer can be provided. The slurry having a PH value of 3 is used in this method so as to decrease the polishing capability when used on tungsten so that the tungsten layer serves as a stop layer. Additionally, silica ($SiO_2$), which is suitable for selectively polishing high points, is added to the slurry. The polishing is performed by a single stage process.

However, in order to selectively form the mask layer at a level to stop the polishing, non-planar areas must be masked, resulting in a decrease of productivity. Accordingly, such decrease of the productivity is prevented by forming the mask layer on the entire surface including high points and selectively polishing the high points by using CMP. In order to polish the hard tungsten in a short time, the polishing capability must be increased in a chemical manner by increasing the PH value of the slurry to an alkaline level, or a polishing powder having a high polishing speed must be added to the slurry. However, such a slurry removes even the tungsten layer which is required to serve as a stop layer, and the stop layer may be completely removed before the copper studs and the polyimide layer are planarized by polishing. As a result, a surface of the layer which must be planarized cannot be a planer surface. Accordingly, in order for the stop layer to function well, a silica slurry having a PH value of 3 must be used in the conventional method. However, the conventional method has a low capability for polishing the tungsten on the high points. Additionally, since alumina ($Al_2O_3$) which can polish copper and polyimide at a high speed is not added to the slurry, a time needed for polishing to achieve a planarized surface is increased, that is, about 90 minutes. This becomes an obstacle to increased productivity of a multi-layer thin film substrate.

SUMMARY OF THE INVENTION

It is a general object of the present invention to provide an improved and useful polishing method for planarizing a substrate in which the above-mentioned problems are eliminated.

A more specific object of the present invention is to provide a polishing method for planarizing a substrate which provides efficient polishing so that a time needed for the polishing is reduced as compared to the conventional method.

In order to achieve the above-mentioned objects, there is provided according to one aspect of the present invention a polishing method for planarizing a substrate having a surface to be polished covered by a polish stop layer, the surface including at least one high area and a low area surrounding the high area, the polishing method comprising:

a first polishing process for removing a portion of the polish stop layer which covers the high area by using a first slurry having a high polishing capability for polishing the polish stop layer; and a second polishing process, subsequent to the first polishing process, for removing the high area by using a second slurry having a high polishing capability for polishing a material covered by the polish stop layer, a polishing capability of the second slurry for polishing the polish stop layer being lower than the polishing capability of the first slurry for polishing against the polish stop layer.

According to the above-mentioned invention, the portion of the polish stop layer covering the high area can be selectively removed at a fast removal rate. Then, the high area from which the polish stop layer has been removed can be easily removed at a fast removal rate until a height of the high area is reduced to be equal to a height of the low area which is still covered by the polish stop layer stopping further abrasion in the second polishing process. Thus, the polished surface is planarized with high accuracy at a uniform height corresponding to a height of the low area. By selectively removing the high area in the first polishing process, a total time for planarizing the surface is greatly reduced as compared to that of the conventional method. Thus, a process time for fabricating a multi-layer thin film substrate can be greatly reduced, which increases productivity of the multi-layer thin film substrate.

In the polishing method according to the present invention, the first polishing process may include providing the first slurry as an alkalized slurry, and the second polishing process may include providing the second slurry as an acidified slurry.

Additionally, the first polishing process may include providing the first slurry containing powder having an average diameter less than 0.1 μm, and the second polishing process may include providing the second slurry containing powder having an average diameter greater than 0.1 μm.

Further, the first polishing process may include providing the first slurry containing powder having a hardness higher than powder contained in the second slurry.

Additionally, in the polishing method according to the present invention, the first polishing process may include providing the first slurry as an alkalized slurry, the first slurry containing powder having an average diameter less than 0.1 μm, the powder contained in the first slurry having a hardness higher than powder contained in the second slurry; and the second polishing process may include providing the second slurry as an acidified slurry, the powder contained in the second slurry having an average diameter greater than 0.1 μm.

Additionally, there is provided according to another aspect of the present invention a method for fabricating a multi-layer thin film substrate, comprising the steps of:

a) forming a first layer on a substrate base;

b) polishing an upper surface of the first layer by a polishing method for planarizing the upper surface covered by a polish stop layer, the surface including at least one high area and a low area surrounding the high area, the polishing method comprising:

a first polishing process for removing a portion of the polish stop layer which covers the high area by using a first slurry having a high polishing capability for polishing the polish stop layer; and a second polishing process, subsequent to the first polishing process, for removing the high area by using a second slurry having a high polishing capability for polishing a material covered by the polish stop layer, a polishing capability of the second slurry for polishing the polish stop layer being lower than the polishing capability of the first slurry for polishing the polish stop layer; and c) forming a second layer on the polished surface of the first layer.

Additionally, there is provided according to another aspect of the present invention a multi-layer thin film substrate fabricated by a process using a polishing method for planarizing a substrate having a surface to be polished covered by a polish stop layer, the surface including at least one high area and a low area surrounding the high area, the polishing method comprising:

a first polishing process for removing a portion of the polish stop layer which covers the high area by using a first slurry having a high polishing capability for polishing the polish stop layer; and a second polishing process, subsequent to the first polishing process, for removing the high area by using a second slurry having a high polishing capability for polishing a material covered by the polish stop layer, a polishing capability of the second slurry for polishing the polish stop layer being lower than the polishing capability of the first slurry for polishing the polish stop layer.

Other objects, features and advantages of the present invention will become more apparent from the following detailed description when read in conjunction with the accompanying drawings.

DETAILED DESCRIPTION OF THE PREFERRED EMBODIMENT

A description will now be given of fabrication of a multi-layer thin film substrate to which a polishing method for planarizing a substrate according to the present invention is applied.

Figure 1A:
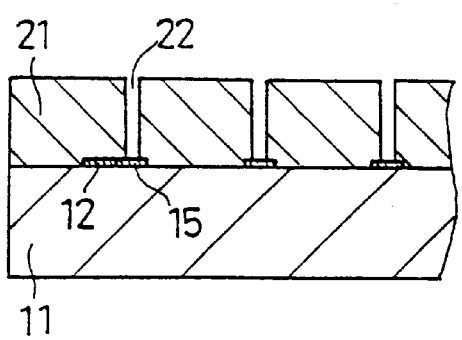
FIGS. 1A–1F are illustrations for explaining a process for fabricating a multi-layer thin film substrate to which a polishing method according to the present invention is applied.
Figure 1B:
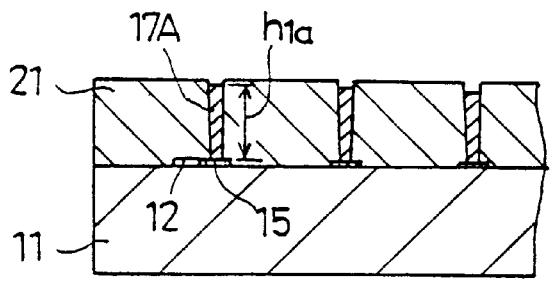
Figure 1C:
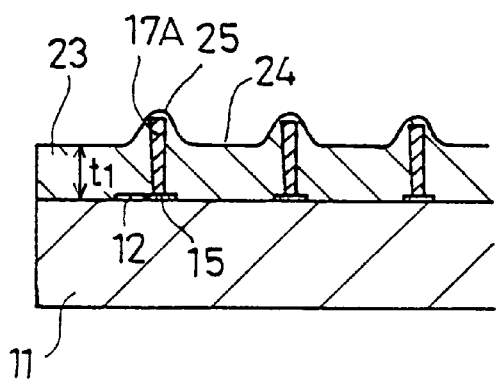
Figure 1D:
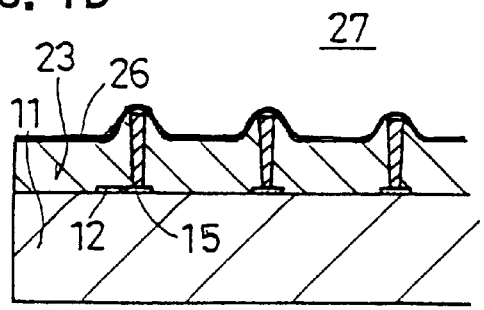
Figure 1E:
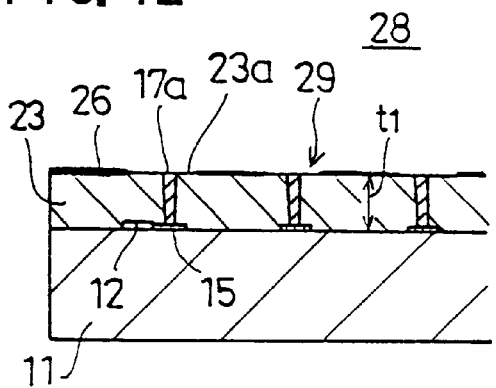
Figure 1F:
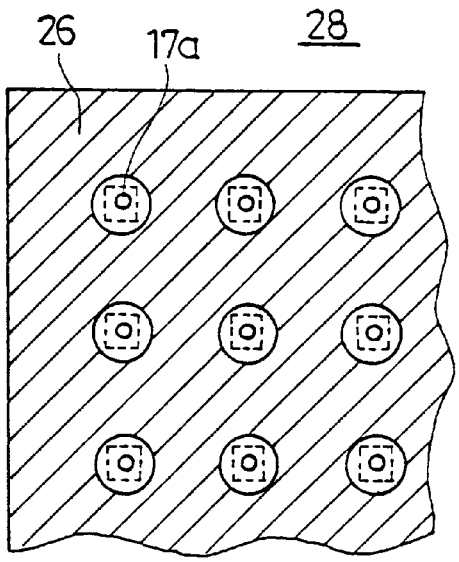
Figure 1G:
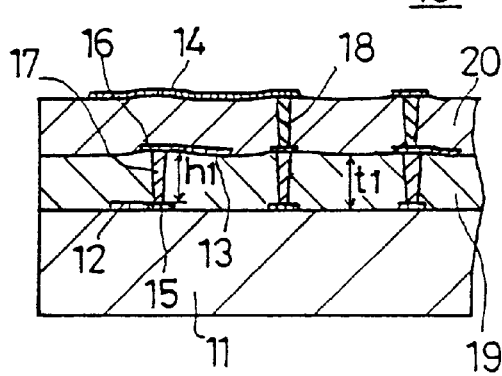

FIG. 1A through FIG. 1G show steps for fabricating a multi-layer thin film substrate 10. The complete multi-layer thin film substrate 10 is shown in FIG. 1G. The multi-layer thin film substrate 10 comprises a ceramic substrate base 11, a first wire pattern 12 formed on the ceramic substrate base 11, a second wire pattern 13 formed on the first wire pattern 12, a third wire pattern 14 formed on the second wire pattern 13. The first wire pattern 12 and the second wire pattern 13 are connected to each other via an interlayer connecting post 17 which connects a pad 15 of the first wire pattern 12 to a pad 16 of the second wire pattern 13. The second wire pattern 13 and the third wire pattern 14 are connected to each other via an interlayer connecting post 18. Thus, the first wire pattern 12 is connected to the third wire pattern 14 via the interlayer connecting posts 17 and 18. A first polyimide layer 19 is provided between the first wire pattern 12 and the second wire pattern 13 so as to insulate the first wire pattern 12 and the second wire pattern 13 from each other. A second polyimide layer 20 is provided between the second wire pattern 13 and the third wire pattern 14 so as to insulate the second wire pattern 13 and the third wire pattern 14 from each other. The interlayer connecting post 17 extends through the first polyimide layer 19, and the second wire pattern 13 is formed on an upper surface of the first polyimide layer 19. The interlayer connecting post 18 extends through the second polyimide layer 20, and the third wire pattern 14 is formed on an upper surface of the second polyimide layer 20.

A description will now be given, with reference to FIGS. 1A through 1G, of a fabrication process of the multi-layer thin film substrate 10.

First, as shown in FIG. 1A, a photoresist layer 21 is formed on an upper surface of the ceramic substrate base 11 on which the first wire pattern 12 and the pad 15 are formed. An aperture 22 is formed in the photoresist layer 21 at a portion corresponding to each pad 15. Then, a copper interlayer connecting post 17A is formed within the aperture 22. A height h1a of the interlayer connecting post 17A is slightly greater than a height h1 of the interlayer connecting post 17 shown in FIG. 1G. Thereafter, the photoresist layer 21 is removed. After the photoresist layer 21 is removed, polyimide is spin coated on the ceramic substrate base 11 so as to form a polyimide layer 23 as shown in FIG. 1C. A thickness of the polyimide layer 23 is controlled to be equal to a thickness t1 of the polyimide layer 19 shown in FIG. 1G. Since the height h1a of the interlayer connecting post 17A is greater than the thickness t1 of the polyimide layer 23, the polyimide layer 23 protrudes at portions corresponding to each interlayer connecting post 17A to cover each post 17A. Accordingly, the state of the surface of the polyimide layer 23 is such that most of the surface has a low area 24. High areas 25, which are higher than the low area 24, are scattered in the low area 24. The interlayer connecting post 17A and the polyimide layer 23 constitute a base structure.

Then, as shown in FIG. 1D, a tungsten (W) polish stop layer 26 is formed on the surface of the polyimide layer 23. A rate for polishing the tungsten polish stop layer 26 is about one-tenth of a rate for polishing the polyimide layer 23. Thus, the tungsten polish stop layer 26 can serve as a polish stop which greatly reduces surface abrasion. A structure shown in FIG. 1D is an object to be polished, and is referred to as a first semi-finished product 27.

The first semi-finished product 27 is then mounted to a polishing apparatus as described later so as to remove a portion of each of the high areas 25 including an upper portion of each post 17A. After the polishing is completed, a second semi-finished product 28 shown in FIG. 1E is obtained. FIG. 1F is a plan view of the second semi-finished product 28 shown in FIG. 1E. It should be noted that the interlayer connecting post 17A becomes the inter-connecting post 17 after the upper portion is removed by polishing. The second semi-finished product 28 has a planar upper surface 29 which includes a surface of the tungsten polish stop layer 26, an upper end surface 17a of each post 17 and a surface of the polyimide layer 23 surrounding the upper end surface 17a of each post 17.

The second semi-finished product 28 having the planer upper surface 29 is subjected to similar processes mentioned above so that the multi-layer thin film substrate 10 shown in FIG. 1G is fabricated.

A description will now be given of a polishing method used for polishing the first semi-finished product 27 to make the second semi-finished product 28.

Figure 2:
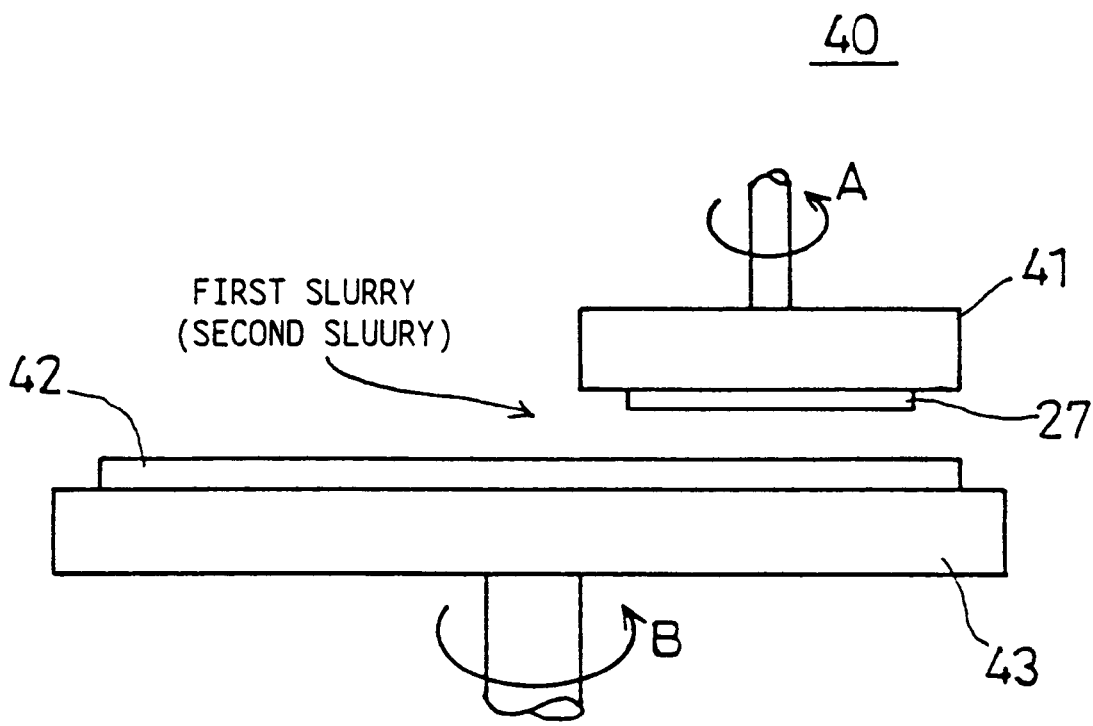
FIG. 2 is an illustration of a part of a polishing apparatus.

The polishing is performed by a polishing apparatus 40 shown in FIG. 2 which performs chemical-mechanical polishing. The polishing apparatus 40 has a rotary disc 41 holding a product to be polished and a large rotary disc 43 provided with a polishing pad 42 thereon. The rotary disc 41 rotates in a direction indicated by an arrow A, and the rotary disc 43 rotates in a direction indicated by an arrow B.

Figure 3:
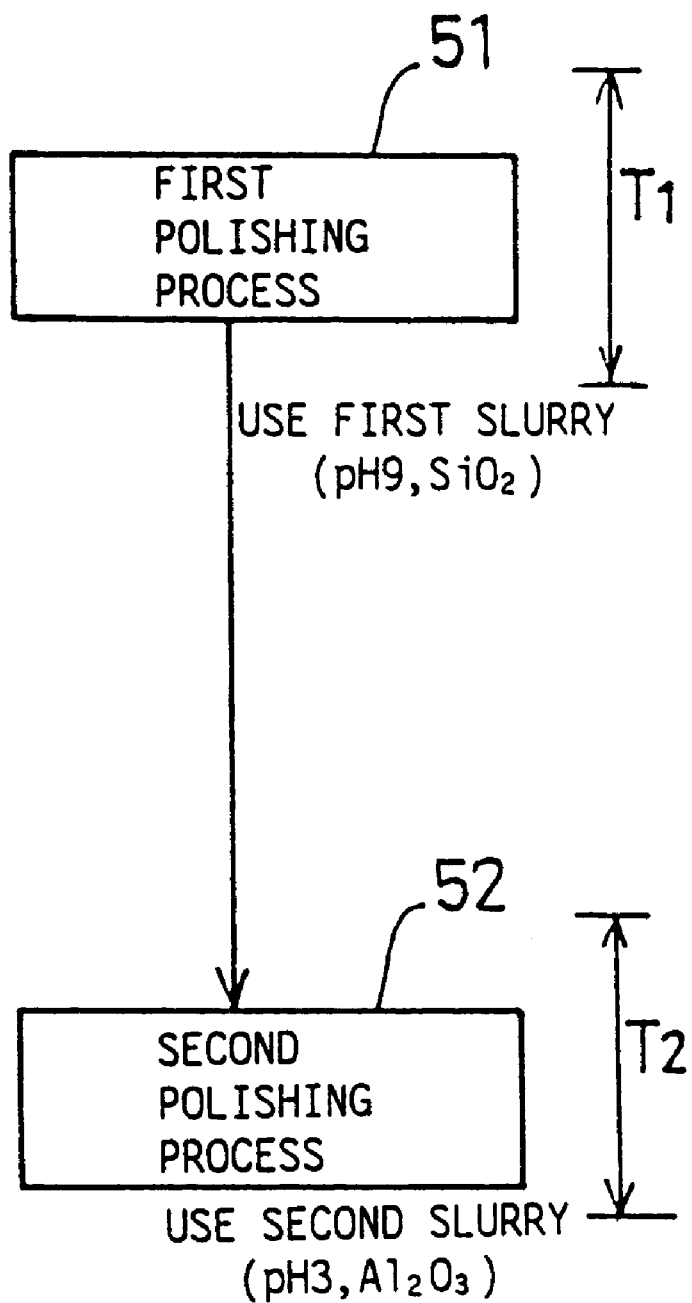
FIG. 3 is a process chart of the polishing process according to the present invention.

FIG. 3 is a process chart of the chemical mechanical polishing for obtaining the second semi-finished product 28 from the first semi-finished product 27. As shown in FIG. 3, the polishing process includes a first polishing process 51 and a second polishing process 52 subsequent to the first polishing process 51. A first slurry is used in the first polishing process 51, and a second slurry is used in the second polishing process 52. That is, the polishing process according to the present invention includes two steps while changing slurries.

Figure 4A:
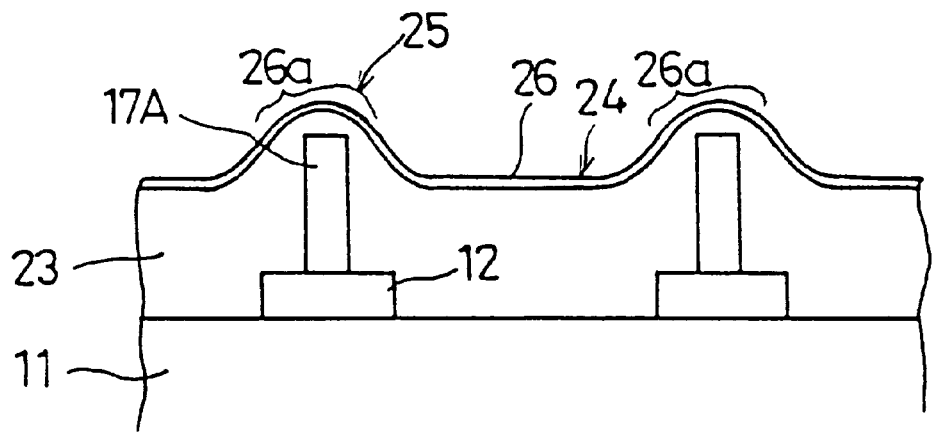
FIGS. 4A–4C are illustrations for explaining the polishing process including first and second polishing processes according to the present invention.
Figure 4B:
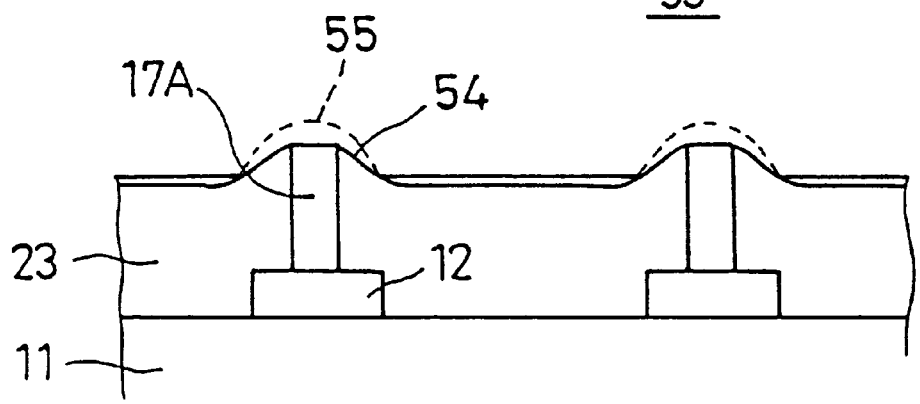
Figure 4C:
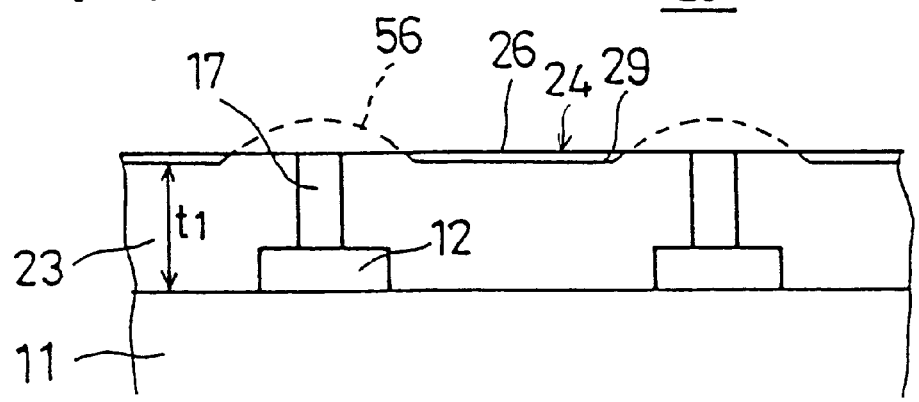

FIGS. 4A to 4C are illustrations for explaining the first and second polishing processes 51 and 52. Referring to FIG. 4A, the first polishing process 51 is performed for polishing protrusions 25 of a surface of the first semi-finished product 27 so as to selectively remove a portion 26a of each of the protrusions 25. In the first polishing process 51, the first semi-finished product 27 is mounted on a bottom surface of the rotary disc 41. Both the rotary disc 41 and the rotary disc 43 are rotated, and the first slurry is applied onto the polishing pad 42. Then, the first semi-finished product 27 is pressed against the polishing pad 42. Since the polishing pad 42 is made of a flexible material, the polishing pad 42 contacts the entire tungsten polish stop layer 26 of the first semi-finished product 27. However, the portion 26a of each protrusion 25 is pressed against the polishing pad 42 with a pressing force larger than a pressing force applied to the surface other than the portion 26a. Additionally, the first slurry used in the first polishing process 51 has a high polishing ability or capability for polishing the tungsten (W). Thus, the portion 26a can be selectively polished since the pressing force applied to the portion 26a is higher than the force applied to the rest of the surface of the tungsten polish stop layer 26. A silica ($SiO_2$) slurry having a PH value of 9 is preferably used as the first slurry in the first polishing process 51 since silica has a hardness higher than a hardness of the tungsten. An average diameter of the silica powder is preferably 0.05 $\mu$m. According to experiments performed with the above-mentioned condition, a polishing time T1 for the first polishing process 51 was about 14 minutes.

As mentioned above, the portion 26a covering the protrusion 25 is removed by the first polishing process 51, and an intermediate semi-finished product 53 shown in FIG. 4B is obtained. In FIG. 4B, a portion indicated by a reference numeral 55 is the portion removed by the polishing. Accordingly, the intermediate semi-finished product 53 has low, gentle protrusions 54. In each of the protrusions 54, the tungsten polish stop layer 26 is removed and, thereby, the polyimide layer 23 and the interlayer connecting post 17A are exposed.

Reasons for the selective removal of the portion 26a and a time for removing the portion 26a being as short as about 14 minutes are as follows.

1) A pressure applied to the protrusions 25 by the polishing pad 42 is high.

2) A PH value of the first slurry is 9 which provides a high rate of polishing for polishing the tungsten polish stop layer 26.

3) A hardness of the silica ($SiO_2$) is higher than a hardness of the tungsten (W) and also higher than a hardness of the alumina ($Al_2O_3$).

4) An average diameter of the silica powder is 0.05 $\mu$m which is less than 0.1 $\mu$m.

After the first polishing process 51 is completed the second polishing process 52 is started. The second polishing process 52 is performed for planarizing a surface of the intermediate semi-finished product 53. In the second polishing process 52, the second slurry is supplied instead of the first slurry while the polishing apparatus 40 is operated. The second slurry is an alumina ($Al_2O_3$) slurry having a PH value of 3. An average diameter of the alumina powder is 0.6 $\mu$m. The hardness of the alumina is higher than the hardness of the tungsten but lower than the hardness of the silica. The PH value of the second slurry is controlled to the value 3 by adding a nitric acid ($HNO_3$). According to the experiments performed with the above-mentioned condition, a polishing time T2 for the second polishing process 52 was about 6 minutes.

As mentioned above, the low, gentle protrusions 54, in which the polyimide layer 23 is exposed, are removed by the second polishing process 52 and, thereby, the second semi-finished product 28 is obtained as shown in FIG. 4C. In FIG. 4C, a portion indicated by a reference numeral 56 is the portion removed by the polishing.

The planar surface 29 is formed on the second semi-finished product 28 by the second polishing process because the tungsten polish stop layer 26, which is provided on the low area 24 occupying most of the surface of the first semi-finished product 27, effectively serves as a polish stop layer. That is, the tungsten polish stop layer 26 serves to stop further abrasion of a low area in the surface of the intermediate semi-finished product 53.

Reasons for the effective functioning of the tungsten polish stop layer 26 as a stop layer are as follows.

1) The rate of polishing of the second slurry against the tungsten polish stop layer 26 is low since the PH value of the second slurry is 3.

2) An average diameter of the alumina powder is 0.6 μm which is greater than 0.1 μm and, thereby, the tungsten polish stop layer 26 is slightly polished.

3) A hardness of the alumina is lower than a hardness of the silica and, thus, the tungsten polish stop layer 26 is hardly polished.

Additionally, reasons for the polishing time being as short as about 6 minutes are as follows.

1) A contact pressure of the low, gentle protrusions 54 of the intermediate semi-finished product 53 is high.

2) In the low, gentle protrusions 54, the tungsten polish stop layer 26 is removed and the polyimide layer 23 is exposed which is easily polished by the second slurry.

It should be noted that the interlayer connecting post 17A is easily polished by the second slurry since it is made of copper. Thus, the upper portion of the interlayer polish stop layer 26 is removed together with the polyimide layer 23 by the second polishing process 52.

As mentioned above, since the tungsten layer 26, which is provided on the low area 24 occupying most of the surface of the first semi-finished product 27, effectively serves as a polish stop layer so as to stop further abrasion of the low area of the surface of the first semi-finished product 27, a height of the surface of the upper surface 29 is determined by a height of the tungsten polish stop layer 26 which covers the low area 24. Thus, the thickness of the polyimide layer 23 is accurately set to t1.

Accordingly, a polishing time of the polishing process including the first and second polishing processes 51 and 52 is reduced to about 20 minutes which is as short as about one quarter of the polishing time of a conventional method which may be about 90 minutes. Thus, the multi-layer thin film substrate 10 according to the present invention can be fabricated with higher productivity as compared to one fabricated by the conventional method.

The present invention is not limited to the specifically disclosed embodiments, and variations and modifications may be made without departing from the scope of the present invention.

What is claimed is:

1. A polishing method for planarizing a substrate having a surface to be polished covered by a polish stop layer, the surface including at least one high area and a low area surrounding the high area, said polishing method comprising:

a first polishing process for removing a portion of said polish stop layer which covers said high area by using a first slurry having a high polishing capability for polishing said polish stop layer; and a second polishing process, subsequent to said first polishing process, for removing said high area by using a second slurry having a high polishing capability for polishing a material covered by said polish stop layer, a polishing capability of said second slurry for polishing said polish stop layer being lower than the polishing capability of said first slurry for polishing said polish stop layer.

2. The polishing method as claimed in claim 1, wherein said first polishing process includes providing said first slurry as an alkalized slurry, and said second polishing process includes providing said second slurry as an acidified slurry.

3. The polishing method as claimed in claim 1, wherein said first polishing process includes providing said first slurry containing powder having an average diameter less than 0.1 μm, and said second polishing process includes providing said second slurry containing powder having an average diameter greater than 0.1 μm.

4. The polishing method as claimed in claim 1, wherein said first polishing process includes providing said first slurry containing powder having a hardness higher than powder contained in said second slurry.

5. The polishing method as claimed in claim 1, wherein said first polishing process includes providing said first slurry as an alkalized slurry, said first slurry containing powder having an average diameter less than 0.1 μm, said powder contained in said first slurry having a hardness higher than powder contained in said second slurry; and said second polishing process includes providing said second slurry as an acidified slurry, said powder contained in said second slurry having an average diameter greater than 0.1 μm.

6. A method for fabricating a multi-layer thin film substrate, comprising the steps of:

a) forming a first layer on a substrate base;

b) polishing an upper surface of said first layer by a polishing method for planarizing the upper surface covered by a polish stop layer, the surface including at least one high area and a low area surrounding the high area, said polishing method comprising:

a first polishing process for removing a portion of said polish stop layer which covers said high area by using a first slurry having a high polishing capability for polishing said polish stop layer; and a second polishing process, subsequent to said first polishing process, for removing said high area by using a second slurry having a high polishing capability for polishing a material covered by said polish stop layer, a polishing capability of said second slurry for polishing said polish stop layer being lower than the polishing capability of said first slurry for polishing said polish stop layer; and c) forming a second layer on the polished surface of said first layer.

7. A multi-layer thin film substrate fabricated by a process using a polishing method for planarizing a substrate having a surface to be polished covered by a polish stop layer, the surface including at least one high area and a low area surrounding the high area, said polishing method comprising:

a first polishing process for removing a portion of said polish stop layer which covers said high area by using a first slurry having a high polishing capability for polishing said polish stop layer; and a second polishing process, subsequent to said first polishing process, for removing said high area by using a second slurry having a high polishing capability for polishing a material covered by said polish stop layer, a polishing capability of said second slurry for polishing said polish stop layer being lower than the polishing capability of said first slurry for polishing said polish stop layer.

* * * * *